United States Patent
Iseki

(10) Patent No.: US 8,228,070 B2
(45) Date of Patent: Jul. 24, 2012

(54) ELECTRONIC APPARATUS AND CONTROL METHOD THEREOF

(75) Inventor: Yukimasa Iseki, Abiko (JP)

(73) Assignee: Canon Kabushiki Kaisha (JP)

( * ) Notice: Subject to any disclaimer, the term of this patent is extended or adjusted under 35 U.S.C. 154(b) by 261 days.

(21) Appl. No.: 11/956,411

(22) Filed: Dec. 14, 2007

(65) Prior Publication Data

US 2008/0143339 A1   Jun. 19, 2008

(30) Foreign Application Priority Data

Dec. 19, 2006   (JP) .................................. 2006-341934

(51) Int. Cl.
   *G01R 31/04*   (2006.01)
(52) U.S. Cl. ....... 324/538; 358/1.15; 358/474; 318/696; 399/8; 399/80
(58) Field of Classification Search ................... 324/538
   See application file for complete search history.

(56) References Cited

U.S. PATENT DOCUMENTS

| | | | | |
|---|---|---|---|---|
| 5,617,021 A * | 4/1997 | Goetting et al. | ......... | 324/762.03 |
| 6,104,198 A * | 8/2000 | Brooks | ......... | 324/538 |
| 6,124,715 A * | 9/2000 | Chakraborty | ......... | 324/537 |
| 6,734,549 B2 * | 5/2004 | Takeoka et al. | ......... | 257/700 |
| 6,851,616 B2 * | 2/2005 | Maruyama | ......... | 235/492 |
| 6,898,544 B2 * | 5/2005 | Whetsel, Jr. | ......... | 702/117 |
| 7,154,280 B2 * | 12/2006 | Bolouri-Saransar et al. | . | 324/538 |
| 2001/0015653 A1 * | 8/2001 | De Jong et al. | ......... | 324/763 |
| 2002/0062466 A1 * | 5/2002 | Noguchi | ......... | 714/738 |
| 2003/0001909 A1 * | 1/2003 | Haitani et al. | ......... | 345/864 |
| 2003/0056165 A1 * | 3/2003 | Whetsel, Jr. | ......... | 714/727 |
| 2003/0101397 A1 * | 5/2003 | Whetsel, Jr. | ......... | 714/726 |
| 2004/0199840 A1 * | 10/2004 | Takeoka et al. | ......... | 714/727 |
| 2004/0204893 A1 * | 10/2004 | Whetsel, Jr. | ......... | 702/117 |
| 2005/0278133 A1 * | 12/2005 | Whetsel, Jr. | ......... | 702/117 |
| 2005/0288828 A1 * | 12/2005 | Claseman | ......... | 701/1 |
| 2007/0011535 A1 * | 1/2007 | Anzou et al. | ......... | 714/733 |
| 2007/0239995 A1 * | 10/2007 | Tucker | ......... | 713/189 |
| 2008/0104464 A1 * | 5/2008 | Elliott | ......... | 714/726 |

FOREIGN PATENT DOCUMENTS

| | | | |
|---|---|---|---|
| JP | 4-368875 A | 12/1992 | |
| JP | 07-270475 A | 10/1995 | |
| JP | 8-95442 A | 4/1996 | |
| JP | 10-132901 A | 5/1998 | |
| JP | 11-118864 A | 4/1999 | |
| JP | 2002-286782 A | 10/2002 | |

* cited by examiner

*Primary Examiner* — Timothy J Dole
*Assistant Examiner* — Benjamin M Baldridge
(74) *Attorney, Agent, or Firm* — Rossi, Kimms & McDowell LLP

(57) ABSTRACT

The present invention enables connections of electronic components of an electronic apparatus to be inspected easily and reliably. To accomplish this, an electronic apparatus including a plurality of electronic components, includes a control circuit which controls input and output of an electric signal to and from the plurality of electronic components and a plurality of inspection circuits which inspect connections of the plurality of electronic components. The plurality of inspection circuits are connected in series, the control circuit is connected to an end of the series, inspection signals output from the plurality of inspection circuits are superimposed on one another in sequence into an signal and the signal is input into the control circuit, and determination is made at the control circuit as to whether each of the plurality of electronic components is connected properly or not.

8 Claims, 7 Drawing Sheets

F I G. 3
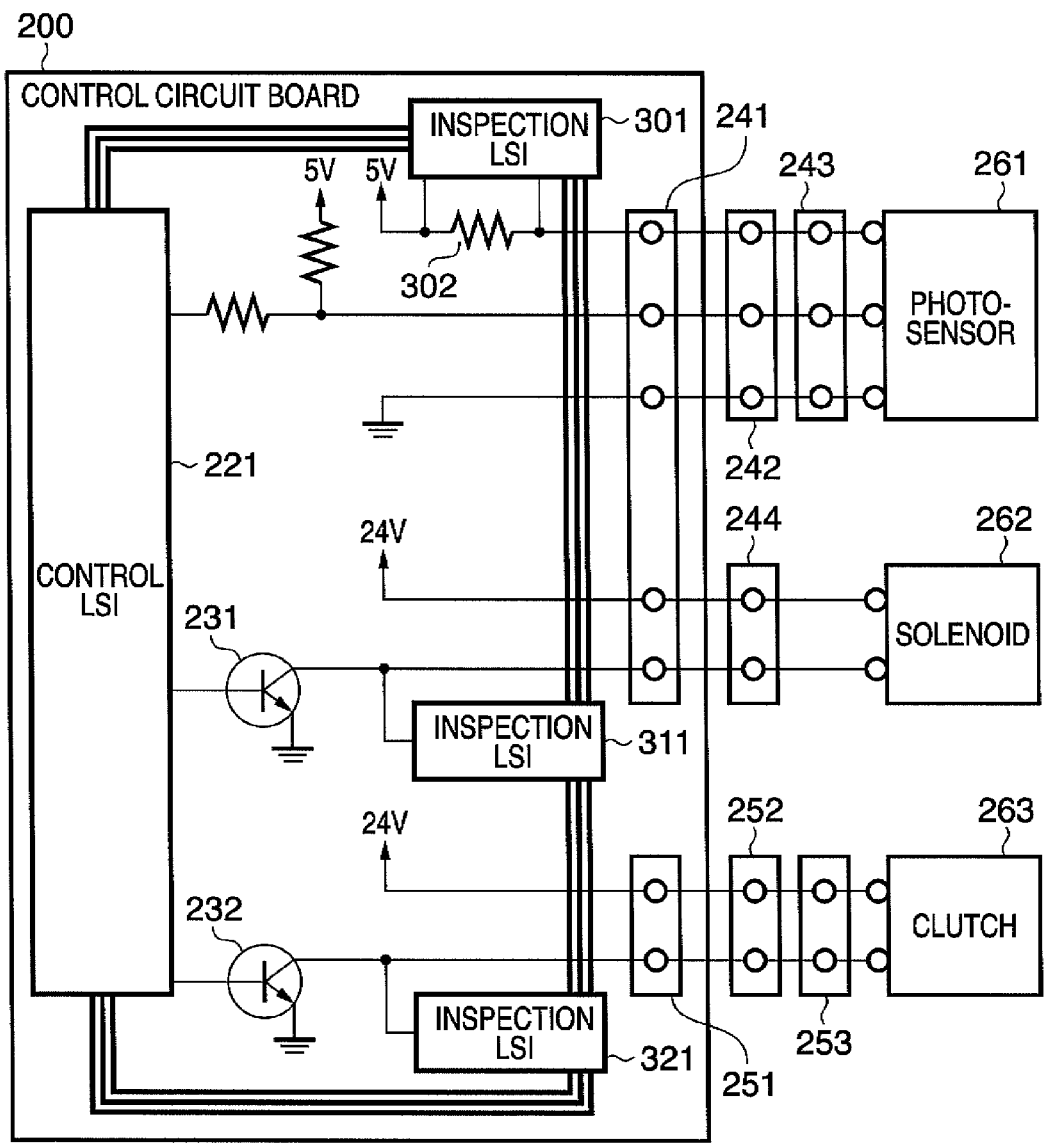

ELECTRONIC APPARATUS AND CONTROL METHOD THEREOF

BACKGROUND OF THE INVENTION

1. Field of the Invention

The present invention relates to a technique for inspecting whether electronic components of an electronic apparatus are connected properly or not.

2. Description of the Related Art

Connections of electronic components of electronic apparatuses having simple configurations have been inspected by detecting a voltage applied to each electronic component (Japanese Patent Laid-Open No. 2002-286782).

However, it is difficult to inspect connections of electronic components (such as solenoids, clutches, motors, and sensors) in complicated electronic apparatuses. For example, it is becoming hard to detect an open-circuit condition caused by a disconnection of a connector or a short circuit caused by a pinched harness, making it difficult to maintain the quality of electronic apparatuses.

Furthermore, conventional methods cannot detect an imperfect connection of an electronic component such as a photo-interrupt sensor in which results of detection by detecting voltages vary depending on the conditions of objects to be detected by the sensor. To determine results of detection, as many input signal controls as the number of objects to be detected are required. Accordingly, a huge number of signals must be handled by a control LSI. Therefore, it was difficult to inspect connections of all components of an apparatus.

SUMMARY OF THE INVENTION

The present invention enables to easily and reliably inspect connections of electronic components of an electronic apparatus.

According to one aspect of the present invention, an electronic apparatus including a plurality of electronic components, comprises:

a control circuit which controls input and output of an electric signal to and from the plurality of electronic components; and a plurality of inspection circuits which inspect connections of the plurality of electronic components, wherein the plurality of inspection circuits are connected in series, the control circuit is connected to an end of the series, inspection signals output from the plurality of inspection circuits are superimposed on one another in sequence into a signal and the signal is input into the control circuit, and determination is made at the control circuit as to whether each of the plurality of electronic component is connected properly or not.

According to another aspect of the present invention, there is provided a control method for an electronic apparatus including a plurality of electronic components, a control circuit which controls input and output of an electric signal to and from the plurality of electronic components, and a plurality of inspection circuits which inspect connection of each of the plurality of electronic components, the plurality of inspection circuits being connected in series, the control circuit being connected to an end of the series, wherein inspection signals output from the plurality of inspection circuits are superimposed on one another in sequence into a signal and the signal is input into the control circuit, and determination is made at the control circuit as to whether connection of each of the plurality of electronic components is connected properly or not.

Further features of the present invention will be apparent from the following description of exemplary embodiments with reference to the attached drawings.

BRIEF DESCRIPTION OF THE DRAWINGS

FIG. 3 is a diagram showing a control circuit board and peripheral components thereof according to an embodiment of the present invention;

DESCRIPTION OF THE EMBODIMENTS

A preferred embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

First Embodiment

Figure 1:
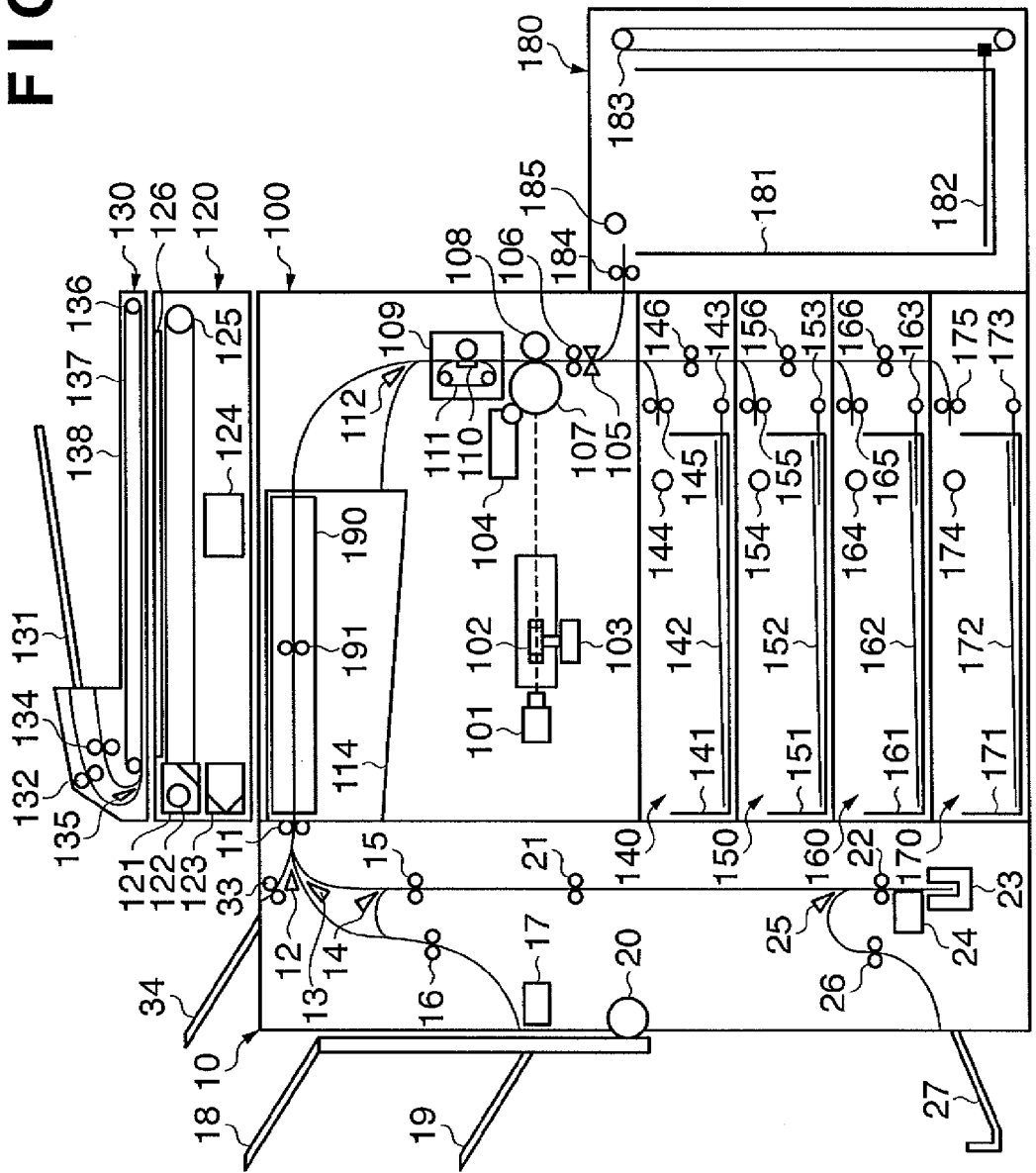
FIG. 1 is a cross-sectional view of a digital copying machine according to an embodiment of the present invention.

An image forming apparatus, which is a first embodiment of an electronic apparatus according to the present invention, will be described below. FIG. 1 shows a configuration of a digital multifunction apparatus, which is an exemplary image forming apparatus. While an image forming apparatus will be described in the embodiment, the present invention is not limited to this but is applicable to any electronic apparatus.

Originals set on an original tray 131 in an original feeder 130 are fed by feeding rollers 132 one by one and are conveyed to an original reading position by an original conveying belt 137 driven by a motor 136. At the original reading position, an original reader 120 reads the original. After the original is read, the original conveying belt 137 rotates in the direction opposite to the initial rotation when the originals were set, thereby conveying the original in the opposite direction. In this conveyance, a flapper 135 changes the conveying path to discharge the original to a discharge tray 138.

Provided in the original reader 120 is an exposure lamp 122, which is a fluorescent lamp, a halogen lamp or the like. The exposure lamp 122 illuminates light toward the surface of an original on a platen glass 126 while moving in the direction (to the right in FIG. 1) perpendicular to its longitudinal direction (the depth direction on the sheet of FIG. 1). Light scattered from the original illuminated with the exposure lamp 122 is reflected by a first mirror 121 and a second mirror 123 and reaches a lens 124. The second mirror 123 moves in the same direction as the first mirror 121 at half the speed of the movement of the first mirror 121. Accordingly, the distance between the surface of original illuminated and the lens 124 is always kept constant. A motor 125 drives the first and second mirrors 121 and 123 to move them. An image on the original is formed on a photoreceiver of a CCD line sensor 127 in which thousands of light receiving elements are arranged in line, through the first and second mirrors 121 and 123 and the lens 124. The image is photoelectrically converted line by line into an electric signal sequentially by the CCD line sensor 127. The photoelectrically converted signal is processed in a signal processor, not shown, and is output as a PWM-modulated signal.

In an image forming unit 100, a PWM-modulated image signal is input in a semiconductor laser 101. The semiconductor laser 101 illuminates a light beam to the surface of a photoconductive element 107 in accordance with the image signal. During this illumination, a polygon mirror 102 rotated by a motor 103 is used to deflect the light beam and the photoconductive element 107 is swept with the light beam in the direction parallel with the axis of the drum-shaped photoconductive element 107. Before the semiconductor laser 101 illuminates a light beam, a primary electric charger, not shown, uniformly charges the surface of the photoconductive element 107. The photoconductive element 107 is illuminated with the light beam corresponding to the image signal while rotating. As a result, an electrostatic latent image according to the image signal is formed on the surface of the photoconductive element 107. A developing device 104 uses a developer (toner) to visualize the electrostatic latent image formed on the surface of the photoconductive element 107.

A sensor 105 detects that a recording sheet, which is a recording material, supplied from sheet supply stages 140, 150, 160, 170, and 180 has reached a resist roller 106. The resist roller 106 controls the timing of feeding of a recording sheet so that the fore-end of the toner image formed on the photoconductive element 107 is aligned with the fore-end of the recording sheet. A transfer electric charger 108 transfers the toner image on the photoconductive element 107 to the recording sheet conveyed. After the transfer, a cleaner, not shown, removes toner remained on the photoconductive element 107.

A fixing unit 109, which includes a ceramic heater 110, a film 111, and two rollers, applies heat to a recording sheet on which a toner image is mounted in order to fix the toner. A direction flapper 112 switches the discharge destination of a recording sheet on which an image is fixed between a tray 114 and a conveying unit 190 depending on operation mode.

A conveying unit 190, which includes conveying rollers 191, conveys a recording sheet to a finisher 10. A sheet deck 180 can hold a larger amount of recording sheets than the sheet supply stages 140, 150, 160, and 170.

The sheet supply stages 140, 150, 160, and 170 have a substantially identical configuration. Disposed at the bottom of cassettes 141, 151, 161, and 171 holding a stack of recording sheets are bottom plates 142, 152, 162, and 172 which are lifted up and down by a lift-up motor 143, 153, 163, and 173. By lifting up the bottom plates 142, 152, 162, and 172, the stack of recording sheets can be held at a predetermined stand-by height. A recording sheet at the predetermined stand-by position is picked up and conveyed by pickup rollers 144, 154, 164, and 174 to conveying roller pairs 145, 155, 165, and 175. The conveying roller pairs 145, 155, 165, and 175 convey recording sheets one by one to a conveying path while keeping the recording media from overlapping.

Conveying roller pairs 146, 156, 166, and 176 are conveying roller pairs that convey a recording sheet conveyed from sheet supply stages at a level lower than the sheet supply stages 140, 150, 160, and 170 further upward.

The sheet deck 180 is capable of holding a larger amount of recording sheet than the sheet supply stages 140, 150, 160, and 170. A paper container 181 capable of containing a large amount of recording sheets has a bottom plate 182 at its bottom that lifts a stack of recording sheets to a stand-by position. The bottom plate 182 is moved up and down by a belt rotated by a motor 183. A recording sheet at the stand-by position is picked up and conveyed by a pickup roller 185 to a conveying roller pair 184, which then conveys the recording sheets to the conveying path while keeping them from overlapping.

A roller 11 of the finisher 10 receives recording sheets provided from the image forming unit 100. When a tray 34 is selected as an output destination of the recording sheet received, a flapper 12 changes the conveying direction and the recording sheet is discharged to the tray 34 by rollers 33. The tray 34 is a discharge tray temporarily used for receiving recording sheets in a job that interrupts another job.

Discharge trays 18 and 19 are usually used. When the conveying path is changed downward by the flapper 12 and then further changed by a flapper 13 toward rollers 16, recording sheets are discharged to the trays 18 and 19. When reverse sheet discharge is performed, the flappers 12 and 13 change the conveying path vertically downward, a reverse roller 15 reverses the conveying direction, and a flapper 14 discharges recording sheets toward the roller 16. When recording sheets are discharged to trays 18 and 19, sets of recording sheets can be optionally stapled by a stapler 17. A shift motor 20 is used to move a tray itself up and down to discharge recording sheets to one of the trays 18 and 19.

A discharge tray 27 is used during binding of recording sheets. Recording sheets are conveyed from a roller 15 to a roller 21 and a predetermined number of recording sheets are accumulated in a primary accumulation unit 23. After a user-specified number of recording sheets are accumulated in the primary accumulation unit 23, a stapler 24 is driven to bind the sheets together. The direction of a flapper 25 is changed and a roller 22 is rotated in the direction opposite to the direction for accumulation to discharge the bound recording sheet to a tray 27 through rollers 26.

FIG. 3 is a schematic diagram showing a configuration according to the present embodiment. Provided on a control circuit board 200 are a control CPU for executing a control program and a ROM and a RAM for storing the control program. By controlling a control LSI 221 in accordance with instructions from the CPU, ROM, and RAM, electronic components are controlled at certain timing in accordance with the control program to form an image. The control LSI 221 functions as a control circuit that controls inputs and outputs of an electric signal to and from the electronic components.

FIG. 3 shows an example in which a photosensor 261, a solenoid 262, and a clutch 263 are connected as electronic components. The electronic components are connected to connectors 241 and 251 on the control circuit board through harnesses. Relay connectors 242, 243, 244, 252, and 253 are provided between the control circuit board 200 and the electronic components. The solenoid 262 and the clutch 263 are controlled by an electric signal that is output from the control LSI 221 and input through drivers 231 and 232. A sensor signal from the photosensor 261 is input in the control LSI 221 through a resistor.

In addition, inspection LSIs 301, 311, and 321 for inspecting disconnection of a connector or a short circuit in harnesses are provided on the control circuit board 200. These inspection LSIs function as inspection circuits for inspecting connections of the electronic components.

In photosensors in general, detection signals vary depending on the conditions of an object to be detected. Therefore, it is impossible to inspect whether a connection to a photosensor is proper or not from a detection signal alone. Therefore, according to the present embodiment, a detection resistor 302 for detecting a current is inserted in a power supply line (+5 V)

for supplying power to the photosensor 261. By using the combination of the inspection LSI 301 and the detection resistor 302, that is, by detecting a voltage drop at the detection resistor 302, a current flowing in the photosensor is detected to inspect whether the photosensor is properly connected.

For electronic components such as a solenoid and a clutch, a voltage applied by a signal output from drivers 231, 232 can be always detected when they are connected. Therefore, the inspection LSI 311 detects a voltage between the driver 231 and the connector 241 to determine whether the solenoid 262 is properly connected. Similarly, the inspection LSI 321 detects a voltage between the driver 232 and the connector 251 to determine whether the clutch 263 is properly connected.

Figure 2:
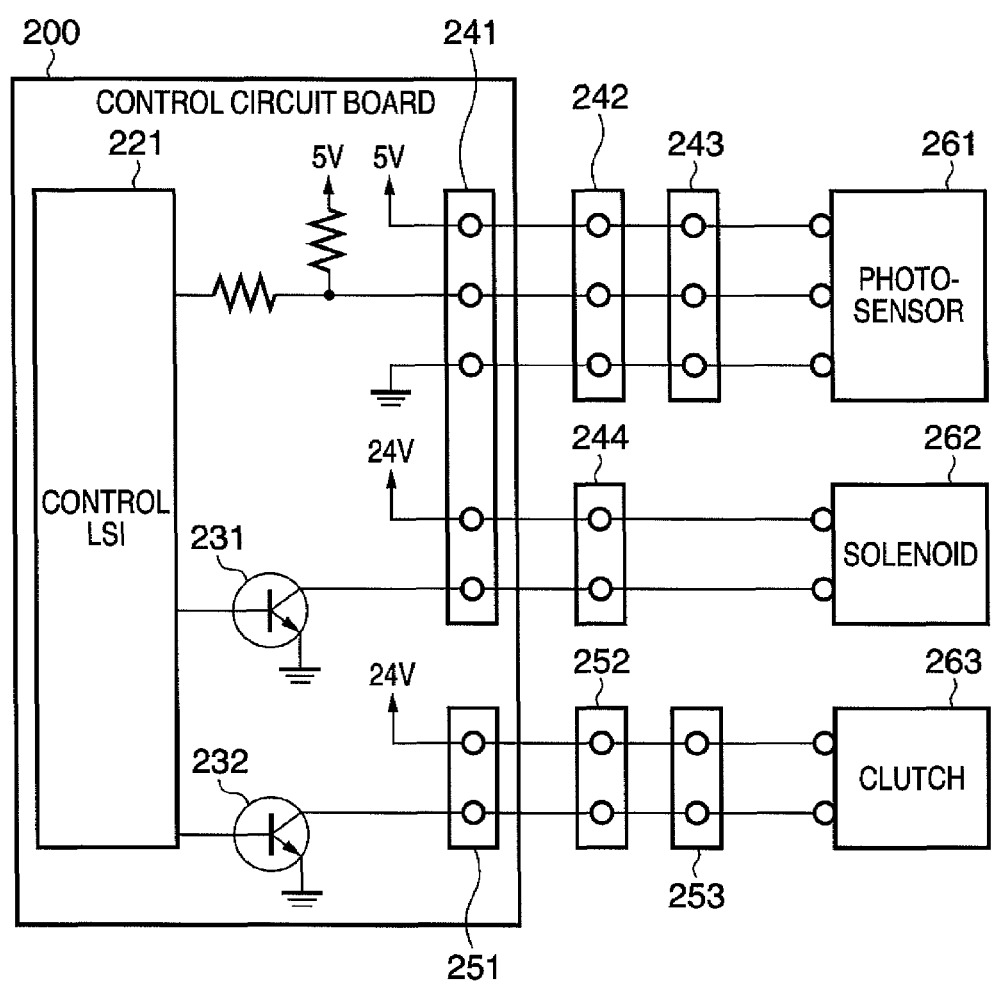
FIG. 2 is a diagram showing a control circuit board without an inspection LSI, and peripheral components thereof.

Unlike the configuration without an inspection LSI (FIG. 2), the configuration as shown in FIG. 3 makes it possible to detect a disconnection of a connector on the circuit board and a relay connector and a short circuit caused by pinched harnesses.

Figure 4:
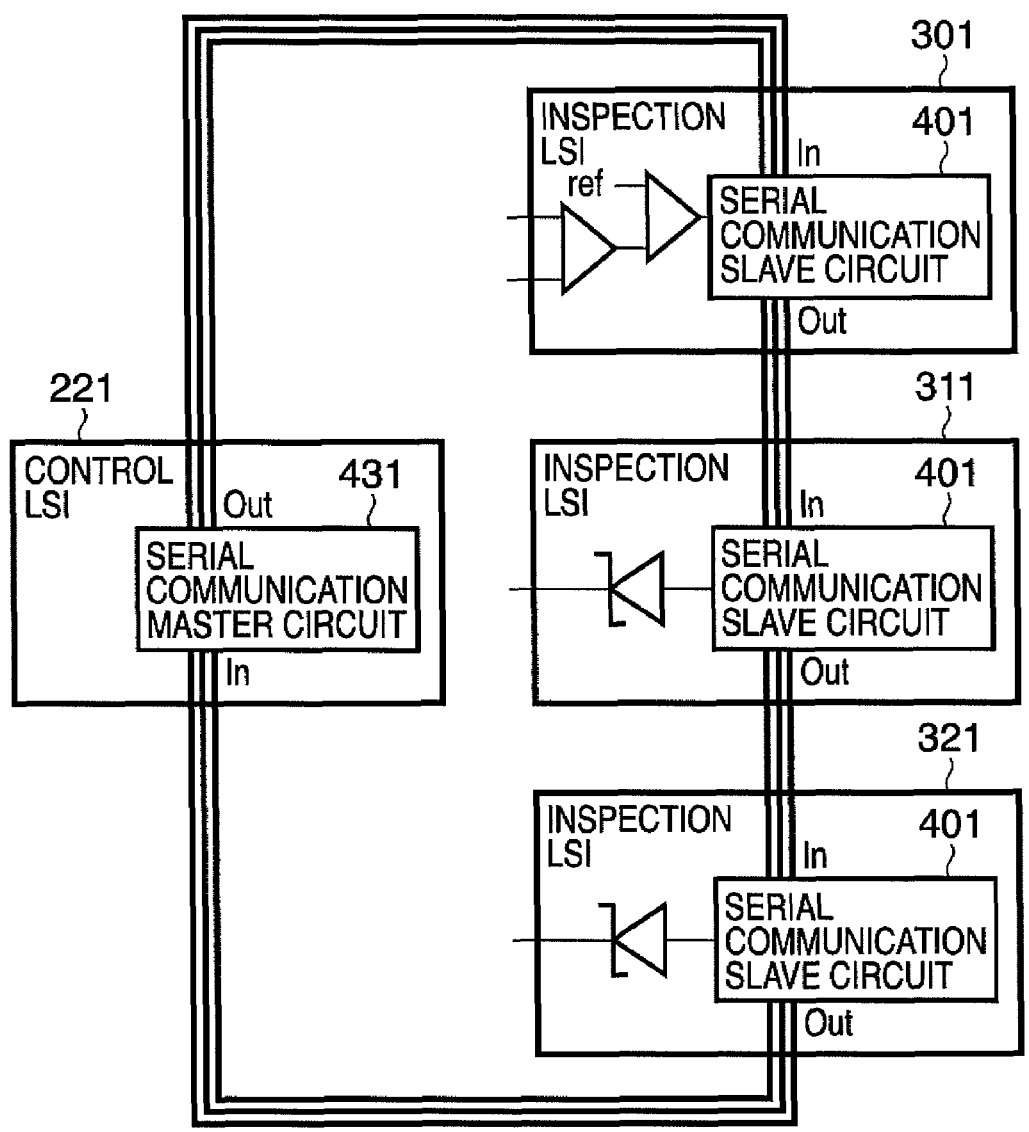
FIG. 4 is a diagram showing a configuration of serial communication according to an embodiment of the present invention.

FIG. 4 shows connections between inspection LSIs 301, 311, and 321 and a control LSI 221. A master circuit 431 for serial communication which controls serial communication is included in the control LSI 221. The master circuit 431 initiates and terminates communication and stores data. A slave circuit 401 for serial communication is included in each of the inspection LSIs 301, 311, and 321. The inspection LSIs 301, 311, and 321 are the same circuits.

In particular, the multiple inspection LSIs are connected in series and the control LSI is connected to the ends. All of the inspection LSIs and the control LSI are connected in a ring-shape.

The inspection LSI 301 includes a detection circuit that amplifies a voltage difference between two points and compares it with a reference voltage (Ref). Each of the inspection LSIs 311 and 321 includes a detection circuit that shifts the level of a voltage. The inspection LSIs 301, 311, 321 output "1" in sequence to the master circuit 431 through their slave circuits 401 if a connection is detected in an inspection. If a connection is not detected, they output "0" to the master circuit 431.

Figure 5:
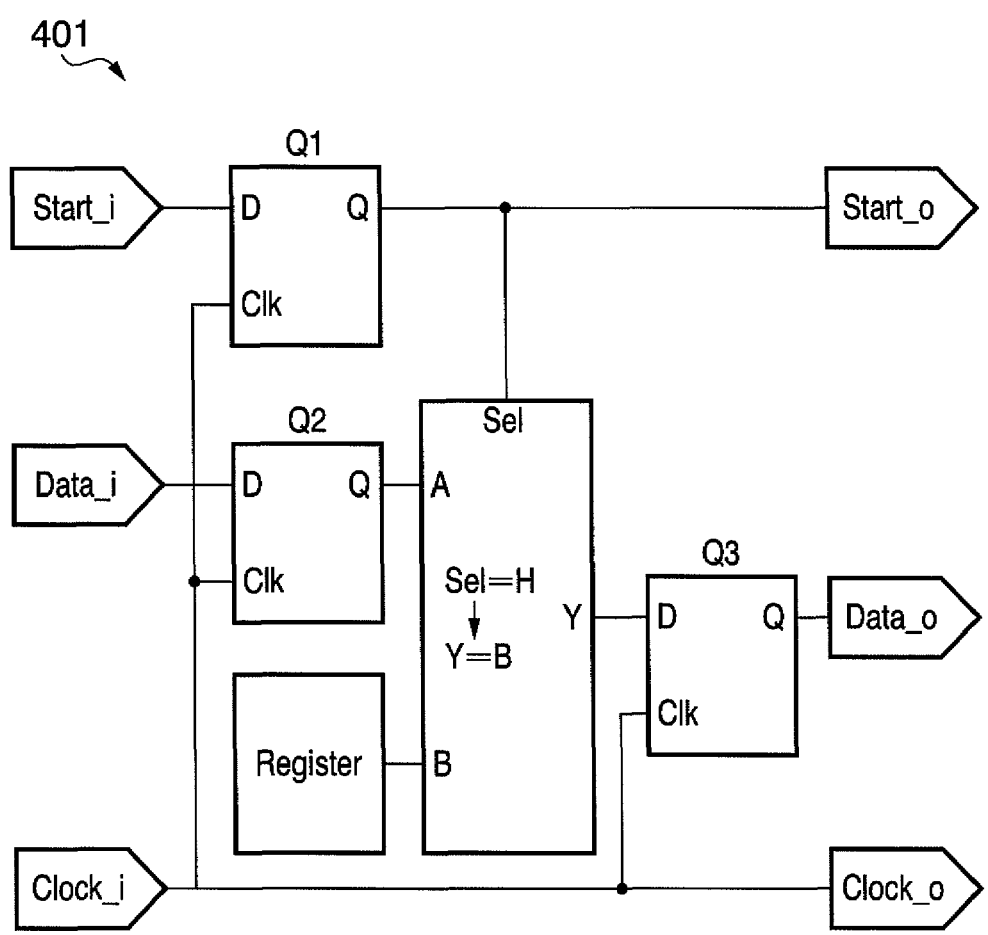
FIG. 5 is a diagram showing a slave circuit according to an embodiment of the present invention.

FIG. 5 shows an internal configuration of a slave circuit 401. The slave circuit 401 performs serial communication using a Start signal (serial transfer Start signal to each LSI), a Clock signal (serial communication transfer clock), and a Data signal (communication data). Each slave circuit 401 includes an input terminal and an output terminal for serial communication. Multiple slave circuits are connected onto a set of serial control lines in series as shown in FIG. 4. A trigger signal output from the output terminal of the master circuit 431 drives slave circuits 401 in sequence and each slave circuit 401 superimposes the result of inspection of the connection of an electronic component by the inspection LSI on the signal and ultimately inputs the signal to the input terminal of the master circuit 431. While three slave circuits 401 are connected in FIG. 4, the present invention is not limited to this; four or more slave circuits may be connected.

Figure 6:
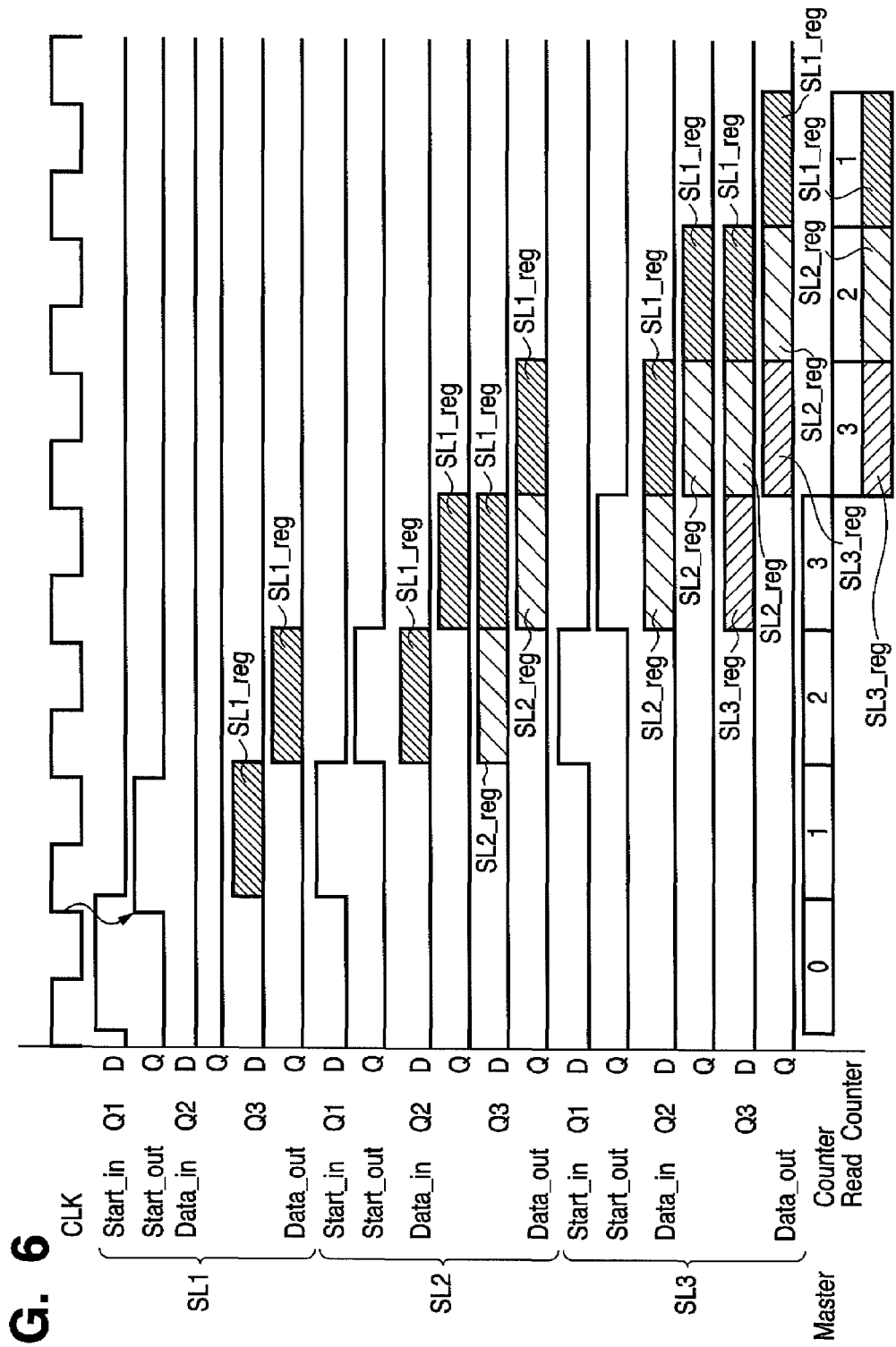
FIG. 6 is a timing chart of serial communication according to an embodiment of the present invention.

FIG. 6 is a timing chart illustrating serial communication by three slave circuits 401. It can be seen that the state of each LSI (SL1_reg, SL2_reg, and SL3_reg) is transferred to the next stage as the Start signal propagates through the three slave circuits (SL1, SL2, and SL3). Consequently, the results of inspections in the multiple LSIs are input in the master circuit 431 at about the same time. That is, inspection signals output from the inspection LSIs are superimposed on one another in sequence into a signal and the signal is ultimately input in the control LSI, where determination is made as to whether each electronic component is connected properly or not. Thus, the control LSI 221 makes determination for multiple electronic components at the same time as to whether they are properly connected.

The master circuit can count clock cycles in the time interval between the initially output Start signal and the Start signal ultimately returned to recognize how many slave circuits are connected on the circuit board. In particular, the Start signal output from the control LSI is delayed at all inspection LSIs in turn and is then returned to the control LSI. Thus, the control LSI detects the number of all of the inspection circuits by counting clock cycles in the delay time between the output of the Start signal from the control LSI and the input of the Start signal to the control LSI. In the example shown in FIG. 6, the Start signal returns to the control LSI at the time when the Counter value is 3. Therefore, it can be found that three slave circuits are connected on the circuit board. In this way, the number of the slave circuits connected on a circuit board can be known by using the Counter value without requiring advance recognition of the number of connections.

Figure 7:
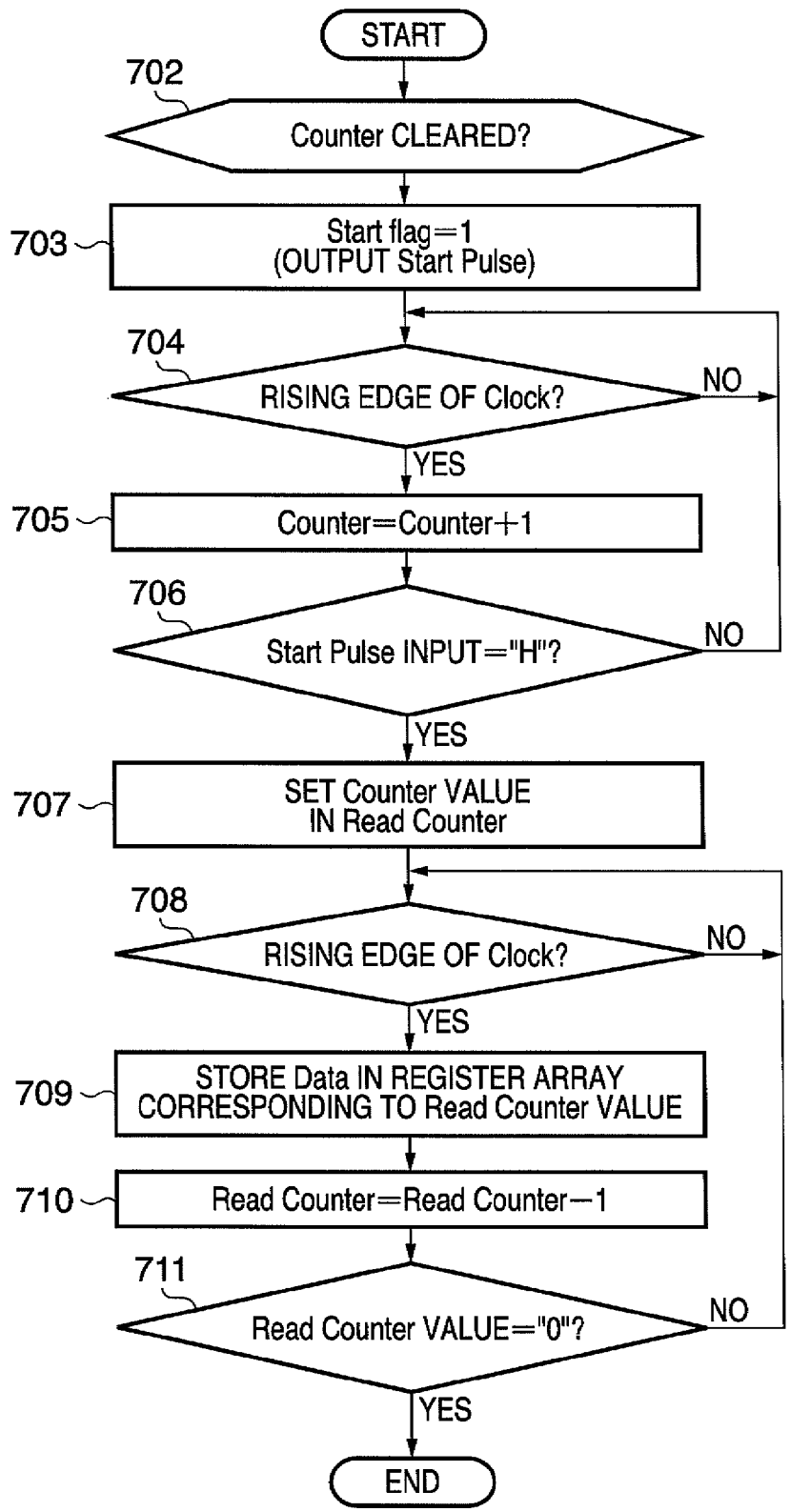
FIG. 7 is a flowchart of a serial communication process according to an embodiment of the present invention.

FIG. 7 is a flowchart of a count process performed in the inspection LSI in the present embodiment. First, the Counter value is cleared as initialization at step S702. Then, a Start signal is output ("1" is assigned to a Start flag) at step 703. The rising edge of the Clock is detected (S704) and the internal Counter is incremented at each rising edge of the Clock (S705). The increment is repeated until the output Start signal goes High again (S706). When the Start signal goes High, the Counter value is stored in a Read Counter (S707). A Data signal is stored in an internal register at each rising edge of the Clock (S709) and the Read Counter value is decremented (S710). Storage of the Data signal in the internal register is repeated until the Read Counter value reaches "0" (S708 to S711).

With this process flow, determination can be made as to whether the each electronic component is connected properly or not. In the present embodiment, three or more registers are provided for use at step S709 of FIG. 7 and data is stored more than once in the process flow in FIG. 7 to determine the data based on majority rule in consideration of loss in communication and the influence of noise.

As has been described above, inspections of connections of electronic components are performed appropriately by combining detection of a current and detection of a voltage and the results of the detection are efficiently collected through the use of serial communication. Thus, defects in electronic apparatuses in manufacturing and on the market can be minimized at low cost.

Second Embodiment

While all inspection LSIs and the control LSI are synchronized using the clock in the first embodiment, the present invention is not limited to this. For example, all inspection LSIs may be connected in line and a control LSI may be connected at the end.

When an electronic component is in connection, two pulses High-High are output in the inspection LSI; when an electronic component is not connected, pulses High-Low are output. The two pulses are delayed for a predetermined amount of time and superimposed. By counting the first of the two pulses, the number of the electronic circuits can be known. By identifying an inspection LSI in which the second one of the two pulses is low, an electronic component that is not properly connected can be identified without needing to synchronize the LSIs with each other using a clock.

This configuration has the advantageous effect that the need for providing the clock and Start signal lines is eliminated and the entire circuitry can be simplified accordingly compared to the first embodiment.

The present invention enables connections of electronic components of an electronic apparatus to be inspected easily and reliably.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-341934 filed on Dec. 19, 2006, which is hereby incorporated by reference herein in its entirety.

What is claimed is:

1. A control device for determining a connection state of a plurality of electronic devices in an image forming apparatus, comprising:
   a connector to which said plurality of electronic devices in the image forming apparatus are connected respectively via first communication lines, each of the first communication lines connecting a different one of said plurality of electronic devices to said connector;
   a control circuit which controls said plurality of electronic devices in the image forming apparatus via the first communication lines;
   a plurality of inspection circuits which respectively inspect connections between each of said plurality of electronic devices in the image forming apparatus and said control circuit, and output an inspection result, and
   a second communication line which connects said plurality of inspection circuits and said control circuit in series,
   wherein said plurality of inspection circuits include a first inspection circuit and a second inspection circuit,
   wherein said first inspection circuit outputs first inspection result information indicating an own inspection result to said second inspection circuit via said second communication line,
   wherein said second inspection circuit combines the first inspection result information and second inspection result information indicating an own inspection result, such that the first inspection result information is followed by the second inspection result information, and outputs the combined result information to said control circuit via said second communication line, and
   wherein said control circuit determines based on the combined result information whether each of said plurality of electronic devices in the image forming apparatus is connected via a corresponding one of the first communication lines properly or not.

2. The control device according to claim 1, wherein each of said plurality of inspection circuits detects a current flowing in an electronic device or a voltage applied to an electronic device.

3. The control device according to claim 1, wherein
   all of said inspection circuits and said control circuit are connected in a ring-shape via said second communication line;
   a start-signal output from said control circuit is delayed at all of said plurality of inspection circuits in turn and is returned to said control circuit; and
   said control circuit counts time units in the delay time between the output of the start-signal from said control circuit and the input of the start-signal into said control signal to detect the number of all of the inspection circuits.

4. The control device according to claim 1, wherein said plurality of electronic devices include at least one of a sensor, a solenoid, and a clutch.

5. The control device according to claim 1, wherein
   said plurality of inspection circuits and said control circuit perform serial communication using a start signal, a clock signal, and a data signal via said second communication line; and
   said second inspection circuit, in response to receiving the start signal, combines the first inspection result information input from the first inspection circuit and the second inspection result information such that the first inspection result information is followed by the second inspection result information in accordance with the clock signal, and outputs the combined result information as the data signal to the control circuit via said second communication line.

6. The control device according to claim 1, wherein said plurality of electronic devices are connected in parallel to the control device via the first communication lines, but are not connected serially with each other.

7. The control device according to claim 1, wherein said plurality of inspection circuits are on a same circuit board as the control circuit, and wherein said plurality of electronic devices are connected to but separate from the circuit board.

8. An image forming apparatus comprising:
   a plurality of electronic devices in the image forming apparatus which control processing for forming an image on a printing medium; and
   a control device for determining a connection state of the plurality of electronic devices in the image forming apparatus, wherein said control device comprises:
   a connector to which said plurality of electronic devices are connected respectively via first communication lines, each of the first communication lines connecting a different one of said plurality of electronic devices to said connector;
   a control circuit which controls said plurality of electronic devices via the first communication lines;
   a plurality of inspection circuits which respectively inspect communications between each of said plurality of electronic devices and said control circuit, and output an inspection result; and
   a second communication line which connects said plurality of inspection circuits and said control circuit in series,
   wherein said plurality of inspection circuits include a first inspection circuit and a second inspection circuit,
   wherein said first inspection circuit outputs first inspection result information indicating an own inspection result to said second inspection circuit via said second communication line,
   wherein said second inspection circuit combines the first inspection result information and second inspection result information indicating an own inspection result, such that the first inspection result information is followed by the second inspection result information, and outputs the combined result information to said control circuit via said second communication line, and
   wherein said control circuit determines based on the combined result information whether each of said plurality of electronic devices in the image forming apparatus is connected via a corresponding one of the first communication lines properly or not.

* * * * *